(12) United States Patent
Liu et al.

(10) Patent No.: US 7,760,116 B2
(45) Date of Patent: Jul. 20, 2010

(54) BALANCED ROTATOR CONVERSION OF SERIALIZED DATA

(75) Inventors: Yin Liu, Fremont, CA (US); Guangyong Zhao, ShangHai (CN); Huaming Chong, ShangHai (CN)

(73) Assignee: Chrontel, Inc, San Jose, CA (US)

( * ) Notice: Subject to any disclaimer, the term of this patent is extended or adjusted under 35 U.S.C. 154(b) by 79 days.

(21) Appl. No.: 12/254,010

(22) Filed: Oct. 20, 2008

(65) Prior Publication Data

US 2010/0097251 A1    Apr. 22, 2010

(51) Int. Cl.
*H03M 9/00* (2006.01)
(52) U.S. Cl. .................................. 341/100; 341/101
(58) Field of Classification Search ............ 341/90–120
See application file for complete search history.

(56) References Cited

U.S. PATENT DOCUMENTS

| | | | | |
|---|---|---|---|---|
| 4,303,885 A | * | 12/1981 | Davis et al. | 324/237 |
| 5,832,043 A | * | 11/1998 | Eory | 375/344 |
| 6,032,531 A | * | 3/2000 | Roszhart | 73/504.04 |
| 7,010,232 B1 | * | 3/2006 | Ott | 398/164 |
| 7,529,313 B2 | * | 5/2009 | Naito et al. | 375/271 |

* cited by examiner

*Primary Examiner*—Lam T Mai
(74) *Attorney, Agent, or Firm*—Raj Abhyanker, LLP (57) ABSTRACT

A method, system, and apparatus of a balanced rotator conversion of serialized data are disclosed. In one embodiment, a method to convert serialized data includes acquiring a rotator module output, and generating a balancing signal with a reference module, which operates with a reference frequency. The method further includes processing the rotator module output and the balancing signal in an interpolation module to generate a balanced rotator output. The method may include a rotator module output that is generated by an analog phase rotator when a control voltage is received by the analog phase rotator. The reference module may include an other analog phase rotator to generate a balancing signal. The interpolation module may interpolate the balancing signal and the rotator module output to modulate a phase of the balanced rotator output. The balanced rotator output may include an orthogonal output.

20 Claims, 6 Drawing Sheets

BALANCED ROTATOR CONVERSION OF SERIALIZED DATA

FIELD OF TECHNOLOGY

This disclosure relates generally to an enterprise method, a technical field of software and/or hardware technology and, in one example embodiment, to a balanced rotator conversion of serialized data.

BACKGROUND

Serialized data may be restored to parallel data using a clock and data recovery (CDR) system, which may be comprised of multiple channels. A multi-channel CDR system may use an analog phase rotator to restore the serialized data to parallel data.

The analog phase rotator may operate in a mode (e.g., a synchronous mode, an asynchronous mode) in which a difference in frequency between an upper threshold speed clock (e.g., an S/C clock) and a transmitter clock may be below a difference threshold. As a result, the analog rotator may be required to provide a clock signal below a rotator threshold value, and the analog rotator may be unable to function properly. In addition, a negative feedback loop may be broken and/or may malfunction. The broken feedback loop may cause a dead zone (e.g., a frequency range in which the rotator may fail to operate) to exist near an approximately zero frequency.

The dead zone, the broken feedback loop, and/or the rotator malfunction may cause the CDR to fail to restore serialized data to parallelized data. This failure may cause a data error to occur, which may cause an inefficiency and/or delay (e.g., a repeat transmission, a corrupted data, a lost signal, a wasted transmission, etc.). These may in turn result in an increased cost of transmission (e.g., an additional time to convert serialized data, an increased power use, a financial transmission cost, etc.). The dead zone may also cause a complete loss of irreplaceable data.

SUMMARY

A method, system, and apparatus of a balanced rotator conversion of serialized data are disclosed. In one aspect, a method to convert serialized data includes acquiring a rotator module output, and generating a balancing signal (e.g., a reference signal) with a reference module, which operates with a reference frequency. The method further includes processing the rotator module output and the balancing signal in an interpolation module (e.g., a module to generate a balanced rotator output). The method may include a rotator module output that is generated by an analog phase rotator when a control voltage is received by the analog phase rotator.

The reference module may include an other analog phase rotator to generate a balancing signal. The interpolation module may interpolate the balancing signal and the rotator module output to modulate a phase of the balanced rotator output. The balanced rotator output may include an orthogonal output, and the balanced rotator output may avoid creating a dead zone.

The frequency of the rotator module may be greater than approximately zero when the reference frequency is greater than a difference between a data clock frequency and a transmitter clock frequency. The balanced rotator output may be zero in a synchronous mode. In the synchronous mode, the data clock frequency may be equal to an input data rate and the rotator module output frequency may be equal to the frequency of the balancing signal. The method may include processing an additional rotator module output and the balancing signal in an additional interpolation module to generate an additional balanced rotator output.

In another aspect, the system to convert serialized data includes a reference module to generate a balancing signal, and a rotator module to convert a voltage into a rotator module output, which includes two or more orthogonal phases. The system also includes an interpolation module to process the rotator module output and the balancing signal to generate a balanced rotator output.

The rotator module may include an analog phase rotator, and the rotator module output may be generated when the rotator module receives a control voltage. The reference module may include an other analog phase rotator to generate a balancing signal. The interpolation module may interpolate the balancing signal and the rotator module output. The balanced rotator output may include an orthogonal output, and it may avoid creating a dead zone (e.g., when a clock frequency and a data frequency are approximately zero).

The frequency of the rotator module may be greater than zero when the reference frequency is greater than a difference between a data clock frequency and a transmitter clock frequency. The system may include processing an additional rotator module output and the balancing signal in an additional interpolation module to generate an additional balanced rotator output.

In yet another aspect, the method to convert serialized data includes forming a reference module to generate a balancing signal, and creating a rotator module to convert a voltage into a rotator module output, which is comprised of at least two orthogonal phases. The method also includes creating an interpolation module coupled to the reference module to process a rotator module output and the balancing signal to generate a balanced rotator output.

The rotator may be comprised of an analog phase rotator, and the rotator module output may be generated when a control voltage is received by the rotator module. The reference module may be comprised of an other analog phase rotator to generate a balancing signal.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method, system, and apparatus of a balanced rotator conversion of serialized data are disclosed. Although the present embodiments have been described with reference to specific example embodiments, it will be evident that various modifications and changes may be made to these embodiments without departing from the broader spirit and scope of the various embodiments. In one embodiment, a balanced rotator (e.g., the balanced rotator module 104 of FIG. 1) is used in a clock and data recovery (CDR) system to convert serialized data.

Figure 1:
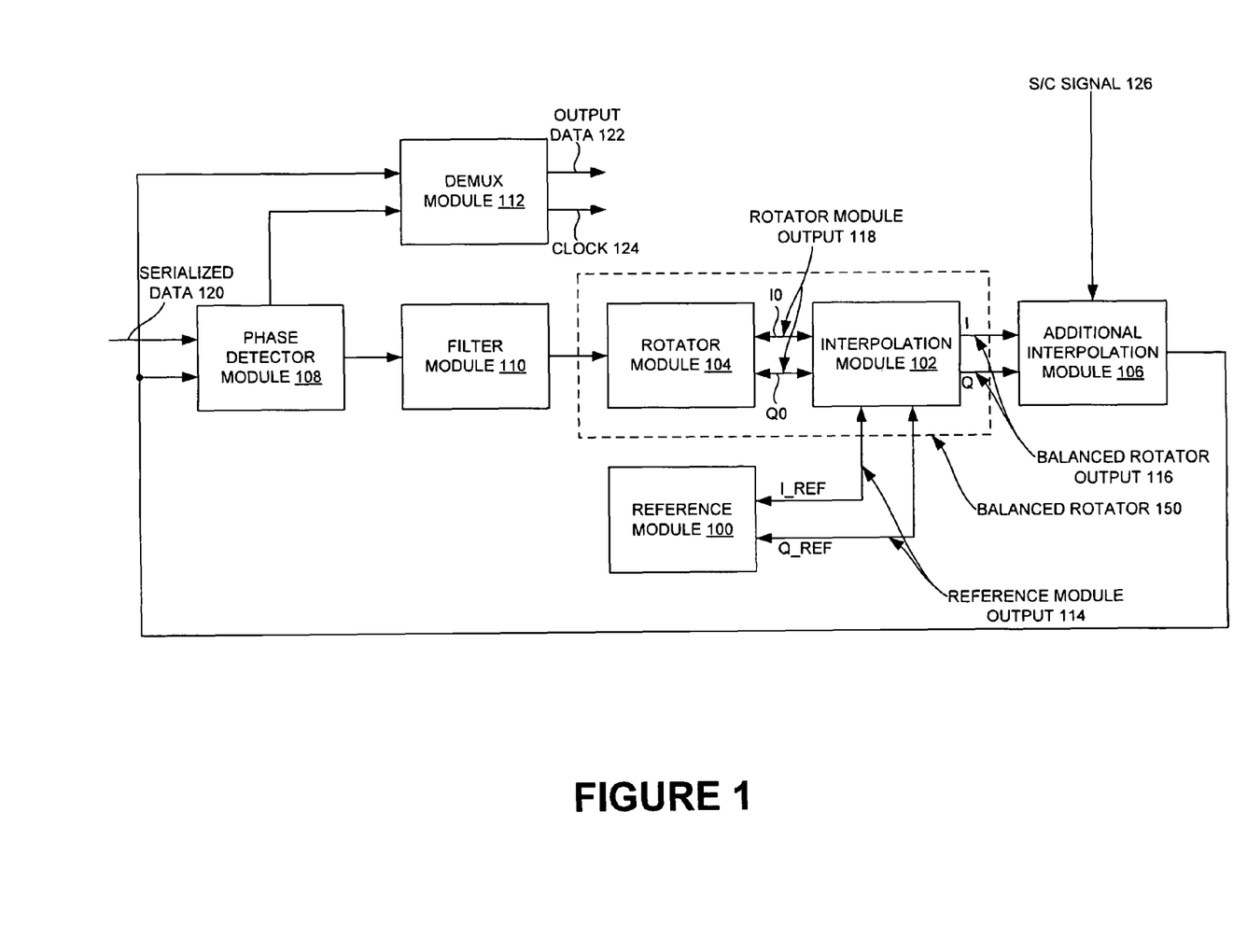
FIG. 1 is a system view of a balanced rotator and a clock and data recovery system, according to one embodiment.

FIG. 1 is a system view of a balanced rotator and a CDR system, according to one embodiment. In particular, FIG. 1 illustrates a reference module 100 (e.g., an additional analog phase rotator), an interpolation module 102, a rotator module 104 (e.g., the analog phase rotator structure of FIG. 4), an additional interpolation module 106, a phase detector module 108 (e.g., a linear phase detector), a filter module 110 (e.g., a second order low pass filter), a demux module 112, a reference module output 114, a balanced rotator output 116, a rotator module output 118, a serialized data 120, an output data 122, a clock 124, an S/C signal 126, and a balanced rotator 150 (eg., a balanced phase rotator, an analog phase rotator). A CDR system may include a charge pump.

Figure 3:
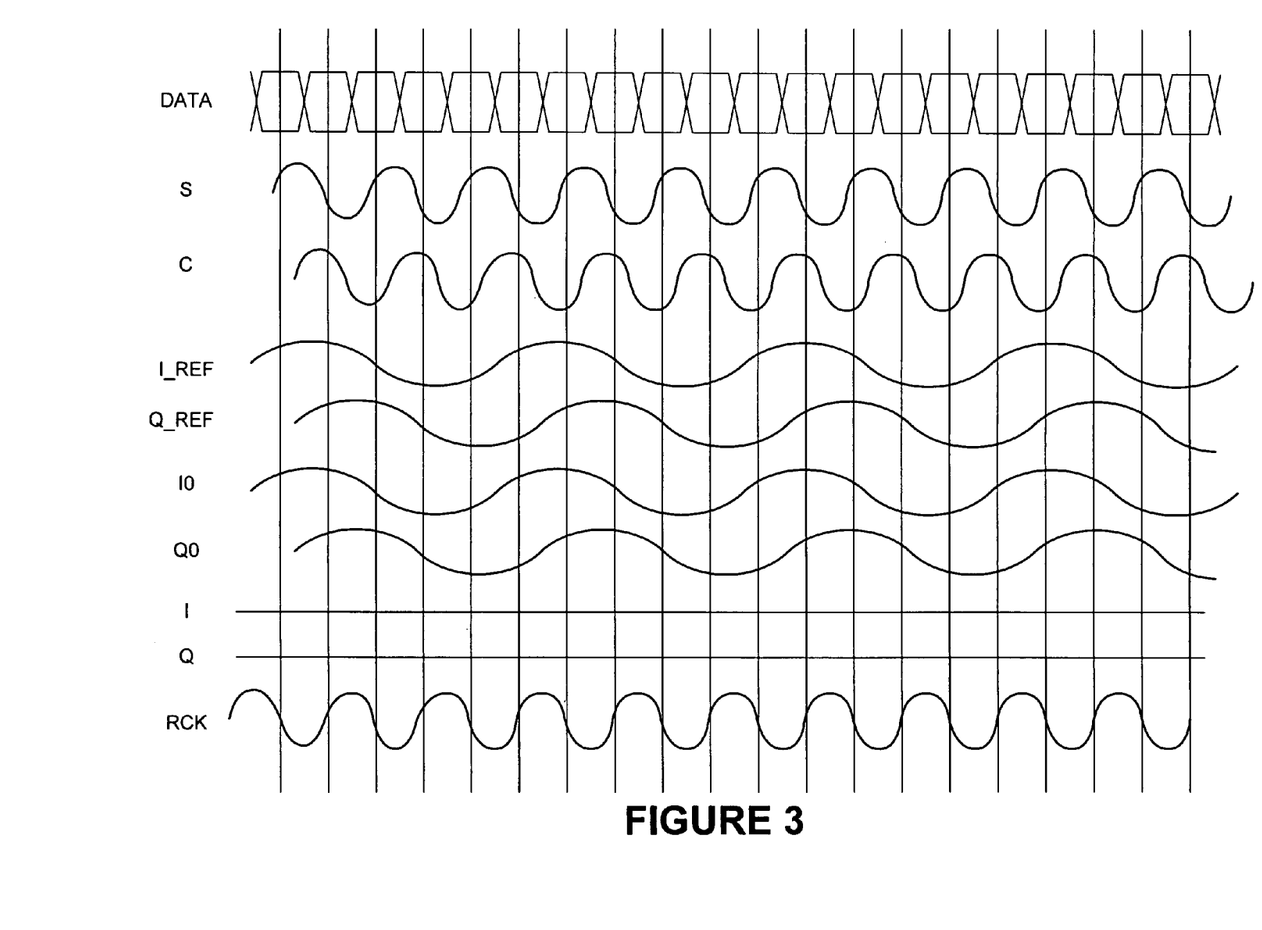
FIG. 3 is an illustration of wave forms of a CDR system and balanced rotator, according to one embodiment.

The balanced rotator 150 may include a rotator module 104, an interpolation module 102, and a reference module output 114. The rotator module 104 may include a rotator structure (e.g., an analog phase rotator, the structure of FIG. 4). The rotator module 104 may convert an incoming voltage (e.g., a control voltage, V as shown in FIG. 3) into orthogonal phases (e.g., the rotator module output 118) I0 and Q0. The rotator module output 118 may be generated when the incoming voltage (e.g., a control voltage) is received. I0 and Q0 may be determined using the following equations:

$$I0 = A \sin(Kr \cdot \int V(t)dt)$$

$$Q0 = A \cos(Kr \cdot \int V(t)dt)$$

Kr may be a rotator gain. I0 and Q0 may be orthogonal, and the I0 and Q0 frequency may be proportional to the input control voltage.

Figure 2:
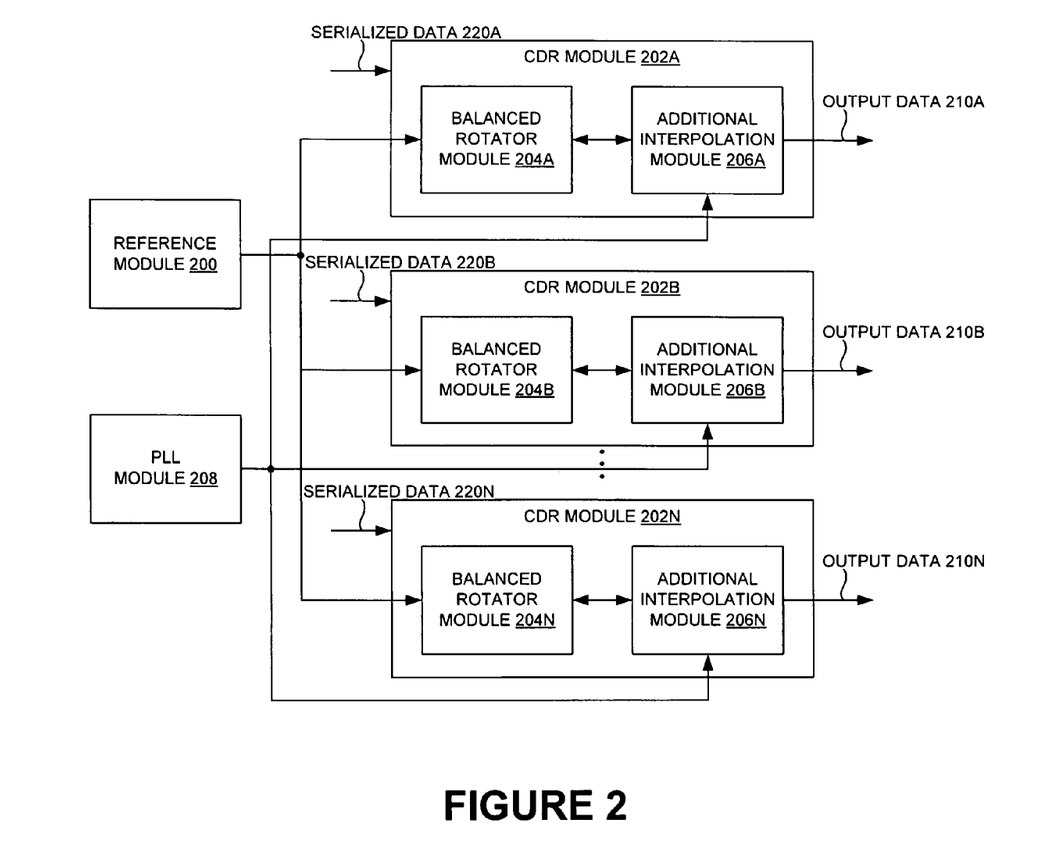
FIG. 2 is a system view of Clock Data Recovery (CDR) modules communicating with a reference module and a PLL module, according to one embodiment.

The balanced rotator 150 may also include a reference module 100, and/or the reference module 100 may be shared across multiple balanced rotators 150. FIG. 2 shows an embodiment of a reference module 200 that may communicate with multiple CDR modules 202A-N that may include balanced rotator modules 204A-N. The reference module 100 may include an additional rotator structure (e.g., an other analog phase rotator, the reference rotator), which may operate on a reference frequency. The additional rotator structure may generate a reference module output 114 (e.g., a balancing signal), I_ref and Q_ref.

The interpolator module 102 may interpolate the output of the rotator module 104 and the reference module output 114 (e.g., the balancing signal) to generate a balanced rotator output 116, I and Q. The balanced rotator output may be orthogonal. The balanced rotator output may be expressed in the following manner:

$$I = I0 \cdot I\_ref + Q0 \cdot Q\_ref$$

$$Q = Q0 \cdot I\_ref + I0 \cdot (-Q\_ref)$$

The output of the phase rotators of the rotator module 104 may be represented as follows:

$$I0 = \cos(\omega)$$

$$Q0 = \sin(\omega)$$

The output of the reference module 100 may be represented as follows:

$$I\_ref = \cos(\omega\_ref)$$

$$Q\_ref = \sin(\omega\_ref)$$

The balanced rotator output 116 may be governed by the equations:

$$I = \cos(\omega - \omega\_ref + \phi)$$

$$Q = \sin(\omega - \omega\_ref + \phi)$$

The reference rotator (e.g., the analog rotator of the reference module 100) may generate a lower threshold speed orthogonal clock signal (e.g., I_ref and Q_ref). The clock signal generated by the reference rotator may use a frequency (e.g., the low speed reference frequency) that is higher than the difference in frequency between an upper threshold speed clock (e.g., an S/C clock) and a transmitter clock frequency (e.g., a serialized data clock, a data frequency). As a result, the required frequency for I0/Q0 may be greater than a threshold value (e.g., zero) while the CDR loop is operating.

The balanced rotator output 116 may thus prevent a dead zone (e.g., a data and/or transmitter clock frequency range in which a rotator does not operate and/or has a zero frequency). The balanced rotator (e.g., the balanced rotator modules 150, 204A-N) may avoid using a single phase rotator (e.g., the analog phase rotator of the rotator module 104) that may generate an infinitely low frequency clock. By avoiding the generation of an infinitely low frequency clock, the balanced rotator may avoid a dead zone entirely.

In a synchronous mode, the high speed reference clock (e.g., the S/C clock) frequency may be equal to the input data rate (e.g., a rate of serialized data). As a result, the balanced phase rotator output clock frequency of I and Q may be zero, and the frequency of I0 and Q0 may be equal to the frequency of I_ref and Q_ref. Illustrated in FIG. 3 are the waveforms of the balanced rotator 150 when the high speed reference clock may be equal to the input data rate, according to one embodiment.

The balanced rotator 150 may be used in a multichannel system. The multichannel system may include multiple CDR modules, each with an input data and an output data. The reference module 100 (e.g., the reference phase rotator, the reference module 200) may be shared by multiple CDR modules (e.g., the system illustrated in FIG. 1, the CDR modules 202A-N). As a result, the balancing signal of the reference module may be processed in an additional interpolation module (e.g., interpolation modules of multiple CDR modules) to generate an additional balanced rotator output.

The multichannel system may also use a shared PLL system. The shared PLL system may include an S/C signal 126 and a high speed reference clock (e.g., the S/C clock).

The phase detector module 108 (e.g., the linear phase detector) may use a clock signal (e.g., a recovered clock signal, an output of the additional interpolation module 106) to sample the serialized data 120 and to get early and/or later information. The phase detector module 108 may control a charge pump source and/or sink current into the filter module 110. As a result, the phase detector module may change the control voltage of the rotator module 104 and/or the balanced rotator 150 (e.g., the balanced rotator modules 204A-N).

The output of the rotator module 104 (e.g., the analog phase rotator of FIG. 4) may have a linear relationship with the control voltage. The interpolator (e.g., the interpolator module 102 and/or the additional interpolator module 106)

may modulate the sample clock by the balanced rotator frequency, which may generate a negative feedback loop (e.g., a Phase Locked Loop (PLL)).

The additional interpolation module 106 may acquire the balanced rotator output 116 and interpolate it with the S/C signal 126 (e.g., a sine signal, a cosine signal, an upper threshold frequency signal, etc.). The additional interpolation module 106 may mix an upper threshold speed S/C phase with a lower threshold speed balanced rotator phase, which may produce the recovered sample clock. The recovered sample clock frequency may be the upper threshold speed frequency (e.g., the S/C clock frequency) minus the lower threshold balanced rotator frequency.

The phase detector module 108 (e.g., a linear phase detector) may control the charge pump source or sink current into the filter module 110 (e.g., the low pass filter). The phase detector module 108 may communicate with a demux module 112, a filter module 110, and/or an additional interpolation module 106. The phase detector module may acquire a serialized data 120 and/or a recovered clock signal from the additional interpolation module 106. The phase detector module 108 may include a charge pump, which may supply charge amounts in proportion to the phase error detected.

The filter module 110 (e.g., a second order low pass filter) may communicate with the phase detector module 108 and/or the balanced rotator 150. The filter module 110 may permit lower threshold frequency signals to pass but may attenuate the amplitude of signals with frequencies higher than a cutoff frequency.

The demux module 112 may communicate with the additional interpolation module 106 and/or the phase detector module 108. The demux module 112 may acquire a clock 124 signal (e.g., a recovered clock signal) from the additional interpolation module 106, and it may acquire an output data 122 (e.g., a recovered data signal) from the phase detector module 108. The demux module 112 may split the output data 122 into multiple signals, which may be carried on separate lines.

FIG. 2 is a system view of Clock Data Recovery (CDR) modules 202A-N communicating with a reference module 200 and a PLL module 208, according to one embodiment. In particular, FIG. 2 illustrates a reference module 200, CDR modules 202A-N, balanced rotator modules 204A-N, interpolation modules 206A-N, a PLL module 208, output data 210A-N, and serialized data 220A-N.

The CDR modules 202A-N may include balanced rotator modules 204A-N and additional interpolation modules 206A-N. The CDR modules 202A-N may acquire serialized data 220 A-N, and they may communicate with the reference module 200 and/or the PLL module 208. The balanced rotator modules 204A-N may communicate with the additional interpolation modules 206A-N.

The reference module 200 (e.g., an analog phase rotator) may provide a shared reference signal (e.g., the reference module output 114) to the balanced rotators 204A-N. The PLL module may provide a shared S/C signal (e.g., the S/C signal 126) and/or an upper threshold speed clock signal to the additional interpolation modules 206A-N. Sharing PLL module signals and a reference module 200 signal may be used to build a multi-channel CDR system, which uses a shared reference rotator and shared high speed PLLs. The multi-channel CDR system may share a single reference phase rotator for multiple channels for power and area savings considerations. The multi-channel CDR system may also share a PLL to save power and to reduce area needs.

FIG. 3 is an illustration of wave forms of a CDR system and balanced rotator, according to one embodiment. In particular, FIG. 3 illustrates a data signal (e.g., a serialized data), an S signal and a C signal (e.g., an S/C signal 126), an I_ref and a Q_ref signal (e.g., orthogonal reference signals, the reference module output 114), an I0 and a Q0 signal (e.g., the rotator module output 118), the I and the Q signal (e.g., the balanced rotator output 116), and an RCK signal (e.g., the recovered clock signal).

In an embodiment, the CDR system and balanced rotator may operate in a synchronous mode, in which the upper threshold speed clock (e.g., the S/C clock) frequency is equal to the rate of the input data (e.g., the serialized data). In the synchronous mode, the balanced phase rotator output (e.g., I and Q) clock frequency may be zero, and the rotator module output (e.g., I0 and Q0) frequency may be equal to the reference module output (e.g., I_ref and Q_ref) frequency. As shown in FIG. 3, the balanced phase rotator may avoid generating an clock below a rotator threshold (e.g., an infinitely low frequency clock), and it may eliminate a dead zone.

Figure 4:
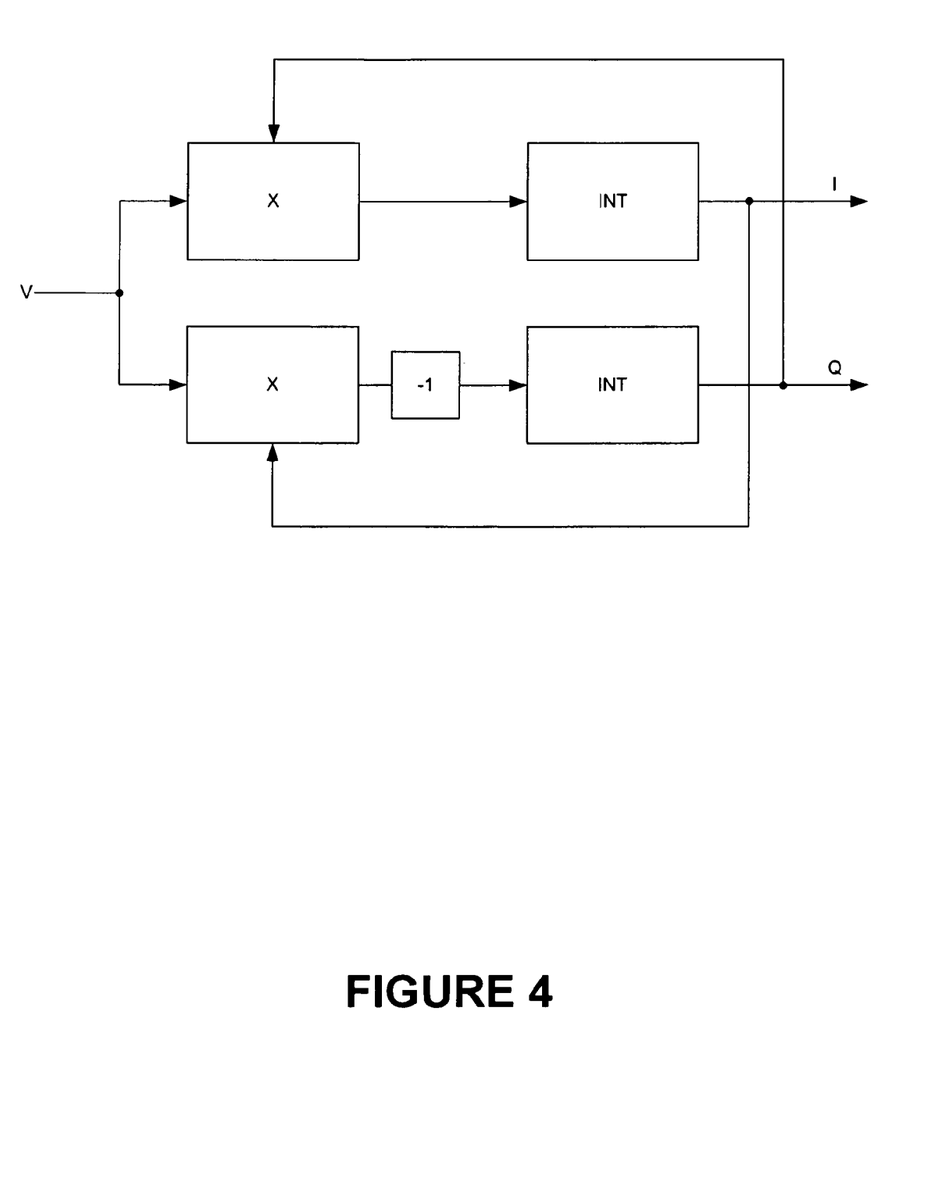
FIG. 4 is a system view of an analog phase rotator, according to one embodiment.

FIG. 4 is a system view of an analog phase rotator, according to one embodiment. In particular, FIG. 4 illustrates how an input control voltage (e.g., V) may be converted into orthogonal phases (e.g., I and Q) in accordance with the following equations:

$$I = A \sin(Kr \cdot \int V(t)dt)$$

$$Q = A \cos(Kr \cdot \int V(t)dt)$$

Kr may be a rotator gain. The frequency of the orthogonal output signals I and Q may be proportional to the input control voltage.

Figure 5:
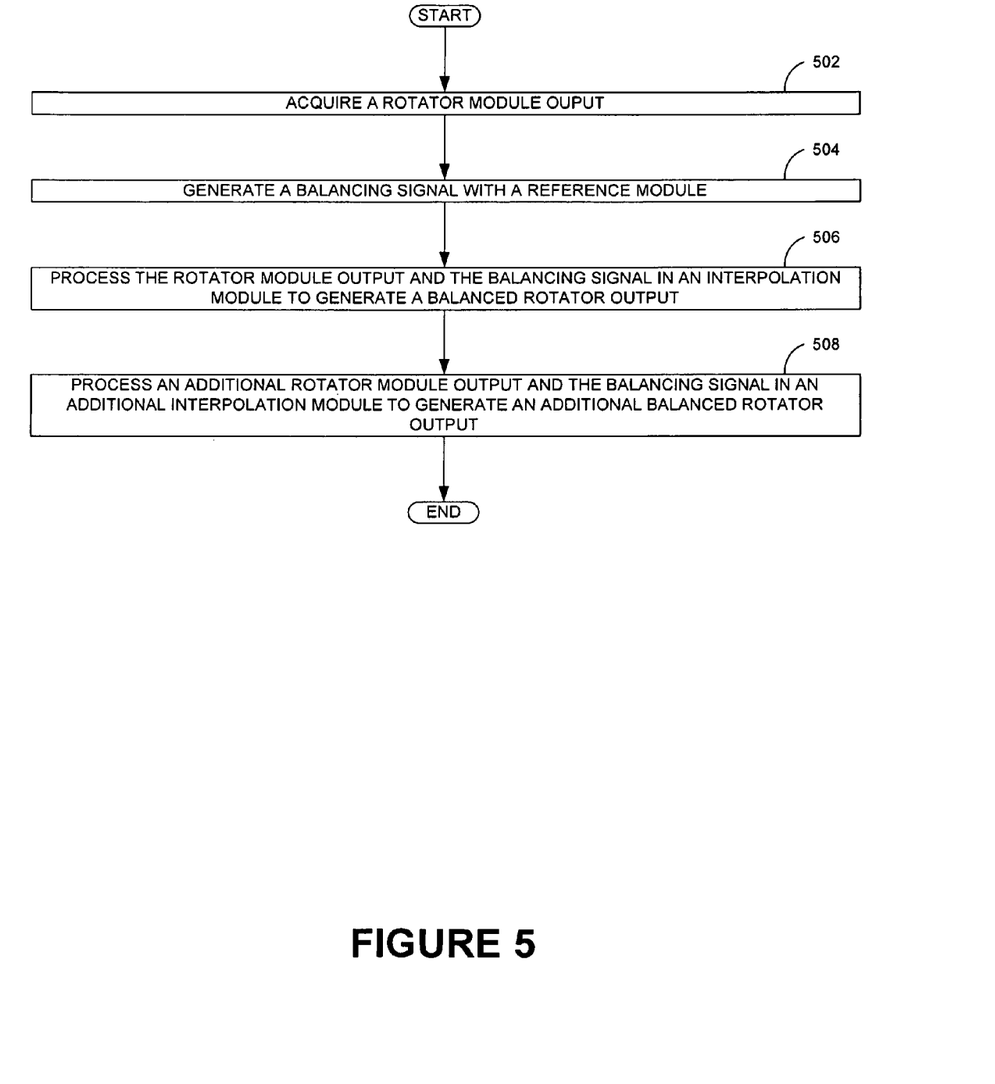
FIG. 5 is a process flow illustrating the processing and balancing of a signal in an interpolation module to generate a balanced rotator output, according to one embodiment.

FIG. 5 is a process flow, illustrating the processing and balancing of a signal in an interpolation module to generate a balanced rotator output, according to one embodiment. In operation 502, a rotator module output (e.g., the rotator module output 118 of FIG. 1) may be acquired. In operation 504, a balancing signal may be generated with a reference module (e.g., the reference module 100 FIG. 1). The reference module 100 may operate with a reference frequency. In operation 506, the rotator module 104 output may be processed and the balancing signal in an interpolation module (e.g., the interpolation module 102 of FIG. 1) may generate a balanced rotator output (e.g., the balanced rotator output 116 FIG. 1).

The rotator module output 118 may be generated by an analog phase rotator when a control voltage is received by the analog phase rotator. The reference module 100 may include an other analog phase rotator to generate a balancing signal. The interpolation module 102 may interpolate the balancing signal and the rotator module output 118 to modulate a phase of the balanced rotator output 116. The balanced rotator output 116 may include an orthogonal output.

The balanced rotator output 116 may avoid creating a dead zone. The frequency of the rotator module 104 may be greater than approximately zero when the reference frequency is greater than a difference between a data clock frequency and a transmitter clock frequency. The balanced rotator output 116 may be zero in a synchronous mode. The data clock frequency may be equal to an input data rate. The rotator module output 118 frequency is equal to the frequency of the balancing signal.

In operation 508, an additional rotator module output 118 may be processed and the balancing signal in an additional interpolation module 106 may generate an additional balanced rotator output 116.

Figure 6:
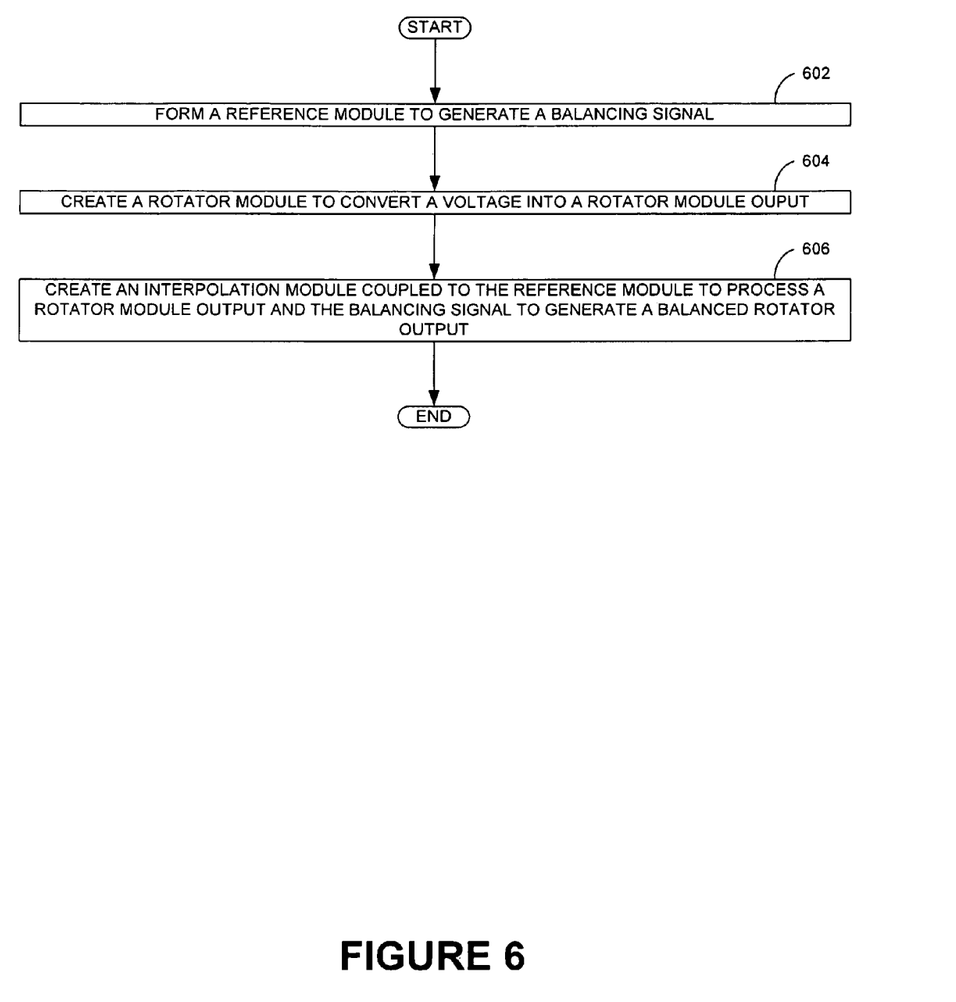
FIG. 6 is a process flow that illustrates forming the reference module and other modules, according to one embodiment.

FIG. 6 is a process flow that illustrates forming the reference module and other modules, according to one embodiment.

In operation 602, a reference module (e.g., the reference module 100 of FIG. 1) may be formed to generate a balancing signal. In operation 604, a rotator module (e.g., the rotator module 104 of FIG. 1) may be created to convert a voltage into a rotator module output 118. The rotator module 104 output may include two orthogonal phases.

In operation 606, an interpolation module (e.g., the interpolation module 102 of FIG. 1) coupled to the reference module 100 may be created to process a rotator module 104 output and the balancing signal may generate a balanced rotator output (e.g., the balanced rotator output 116 of FIG. 1). The rotator module 104 may include an analog phase rotator. The rotator module output 118 may be generated when a control voltage is received by the rotator module 104. The reference module 100 may include an other analog phase rotator that may generate a balancing signal.

In particular, the reference module 100, the interpolation module 102, the rotator module 104, the additional interpolation module 106, the phase detector module 108, the filter module 110, the demux module 112, the balanced rotator 150, the reference module 200, the CDR modules 202A-N, the balanced rotator modules 204A-N, the interpolation modules 206A-N, the PLL module 208, and the output data modules 210A-N, of FIGS. 1 to 4 may be enabled using a reference circuit, an interpolation circuit, a rotator circuit, an additional interpolation circuit, a phase detector circuit, a filter circuit, a demux circuit, software and/or transistors, logic gates, electrical circuits (e.g., application specific integrated ASIC circuitry), and other circuits.

In addition, it will be appreciated that the various operations, processes, and methods disclosed herein may be embodied in a machine-readable medium and/or a machine accessible medium compatible with a data processing system (e.g., a computer system), and may be performed in any order (e.g., including using means for achieving the various operations). Accordingly, the specification and drawings are to be regarded in an illustrative rather than a restrictive sense.

What is claimed is:

1. A method to convert serialized data, comprising:
    acquiring a rotator module output;
    generating a balancing signal with a reference module, wherein the reference module operates with a reference frequency; and
    processing the rotator module output and the balancing signal in an interpolation module to generate a balanced rotator output.

2. The method of claim 1, wherein the rotator module output is generated by an analog phase rotator when a control voltage is received by the analog phase rotator.

3. The method of claim 2, wherein the reference module is comprised of an other analog phase rotator to generate the balancing signal.

4. The method of claim 3, wherein the interpolation module interpolates the balancing signal and the rotator module output to modulate a phase of the balanced rotator output.

5. The method of claim 4, wherein the balanced rotator output is comprised of an orthogonal output.

6. The method of claim 5, wherein the balanced rotator output avoids creating a dead zone.

7. The method of claim 1, wherein the frequency of the rotator module is greater than approximately zero when the reference frequency is greater than a difference between a data clock frequency and a transmitter clock frequency.

8. The method of claim 2, wherein the balanced rotator output is zero in a synchronous mode, wherein a data clock frequency is equal to an input data rate, and wherein the rotator module output frequency is equal to the frequency of the balancing signal.

9. The method of claim 1, further comprising processing an additional rotator module output and the balancing signal in an additional interpolation module to generate an additional balanced rotator output.

10. A system to convert serialized data, comprising
    a reference module to generate a balancing signal;
    a rotator module to convert a voltage into a rotator module output, wherein the rotator module output is comprised of at least two orthogonal phases; and
    an interpolation module to process the rotator module output and the balancing signal to generate a balanced rotator output.

11. The system of claim 10, wherein the rotator module is comprised of an analog phase rotator, and wherein the rotator module output is generated when a control voltage is received by the rotator module.

12. The system of claim 11, wherein the reference module is comprised of an other analog phase rotator to generate a balancing signal.

13. The system of claim 12, wherein the interpolation module interpolates the balancing signal and the rotator module output.

14. The system of claim 13, wherein the balanced rotator output is comprised of an orthogonal output.

15. The system of claim 14, wherein the balanced rotator output avoids creating a dead zone.

16. The system of claim 10, wherein the frequency of the rotator module is greater than approximately zero when the reference frequency is greater than a difference between a data clock frequency and a transmitter clock frequency.

17. The system of claim 16, further comprising processing an additional rotator module output and the balancing signal in an additional interpolation module to generate an additional balanced rotator output.

18. A method to convert serialized data, comprising:
    forming a reference module to generate a balancing signal;
    creating a rotator module to convert a voltage into a rotator module output, wherein the rotator module output is comprised of at least two orthogonal phases; and
    creating an interpolation module coupled to the reference module to process a rotator module output and the balancing signal to generate a balanced rotator output.

19. The method of claim 18, wherein the rotator module is comprised of an analog phase rotator, and wherein the rotator module output is generated when a control voltage is received by the rotator module.

20. The method of claim 19, wherein the reference module is comprised of an other analog phase rotator to generate a balancing signal.

* * * * *